United States Patent [19]

Doble

[11] Patent Number: 5,189,362

[45] Date of Patent: Feb. 23, 1993

[54] HIGH FREQUENCY SIGNAL MEASUREMENT CIRCUITS UTILIZING TEMPERATURE-SENSITIVE DEVICES

[76] Inventor: Richard G. V. Doble, 42, Denmark Rd., Ealing W138RG, United Kingdom

[21] Appl. No.: 637,214

[22] Filed: Jan. 3, 1991

[30] Foreign Application Priority Data

| Jan. 9, 1990 | [GB] | United Kingdom | 9000479 |
| Jan. 19, 1990 | [GB] | United Kingdom | 9001223 |
| Feb. 22, 1990 | [GB] | United Kingdom | 9004025 |
| Aug. 20, 1990 | [GB] | United Kingdom | 9018272 |

[51] Int. Cl.$^5$ .................................. G01R 21/02
[52] U.S. Cl. ................... 324/106; 324/706; 324/725
[58] Field of Search ........ 324/702, 703, 706, 725, 324/98, 99 R, 104–106

[56] References Cited

U.S. PATENT DOCUMENTS

| 3,093,732 | 6/1963 | Clark | 324/106 |
| 3,624,525 | 11/1971 | Smith | 324/106 X |
| 3,626,290 | 12/1971 | Aslan | 324/106 |
| 3,723,845 | 3/1973 | Duckworth | 324/106 X |
| 3,911,359 | 10/1975 | Metcalf | 324/106 |
| 4,023,099 | 5/1977 | van Kessel et al. | 324/106 X |

Primary Examiner—Jack B. Harvey
Attorney, Agent, or Firm—Ladas & Parry

[57] ABSTRACT

A circuit for measuring the R.M.S. voltage of a high frequency signal (e.g. 100MHz) comprises two series-connected ntc thermistors (TH1, TH2) in a bridge circuit which is energized by a current source (1). The unknown signal is applied across one (TH1) of the thermistors and the resulting change in the resistance causes a D.C. output voltage to appear across the balanced terminals (T3, T4) of the bridge. This output voltage is proportional to the square of the R.M.S. voltage of the A.C. signal. In another embodiment, two ptc thermistors are connected in parallel in a bridge circuit which is energized by a voltage source, and are used to measure R.M.S. current. In each case, the thermistors are preferably operated in a negative slope resistance portion of their voltage-current characteristic. In a further embodiment two balanced bridges, each incorporating two thermistors, are connected in series in one arm of a bridge circuit, and a compensating signal is applied by a feedback circuit to one bridge so as to match the heating effect of the unknown A.C. signal applied to the other bridge.

20 Claims, 5 Drawing Sheets

HIGH FREQUENCY SIGNAL MEASUREMENT CIRCUITS UTILIZING TEMPERATURE-SENSITIVE DEVICES

The present invention relates to a circuit and method for measuring alternating currents and voltages, particularly for measuring high frequency alternating currents and voltages of frequency 0.5 Mhz or greater, for example. The invention also relates to a circuit for converting an unknown A.C. signal to a related D.C. signal, which may for example be measured with a conventional meter connected to external terminals of the circuit.

A known method of measuring the peak value of a high frequency A.C. signal involves rectifying the signal with a fast-response diode such as a germanium diode and measuring the resulting rectified voltage. However the capacitance of the diode introduces a frequency-dependent error. Furthermore it is often desirable to make R.M.S. measurements, which cannot be obtained directly by any method involving rectification of the signal to be measured.

A simple Wheatstone bridge circuit having a thermistor in one branch is disclosed in GB 558,299 for measuring temperature, and includes a meter, calibrated in units of temperature, connected across opposite terminals of the bridge. It is indicated that an indirectly heated thermistor might be used in such a circuit to measure A.C., if the meter were suitably calibrated in units of current, but such an arrangement would obviously be very non-linear and would be dependent on the precise thermistor characteristics, requiring individual calibration.

So-called thermal converters utilising indirectly heated thermistors in balanced bridge circuits are known to be capable of making highly accurate R.M.S. A.C. measurements, but their readings are critically dependent on the thermistor characteristics and they therefore require an accurately known D.C. which can be varied to match the heating effect of the A.C. Consequently instruments based on such circuits are expensive. Furthermore, readings cannot be taken quickly with such instruments, because the heat capacity of the thermistor heaters leads to a delay in attaining thermal equilibrium.

FR-A-2,274,926 discloses a bridge circuit in which two indirectly heated transistors are used as temperature-sensitive devices. A differential amplifier connected to the respective collectors of the transistors generates a feedback signal which is applied to the heater of one transistor so as to balance the bridge. An unknown alternating voltage is applied to the heater of the other transistor and, assuming the transistors are identical, the voltage output of the amplifier is equal to the R.M.S. input voltage. Although this arrangement has the advantage of producing an output signal which is simply related to the input signal, it has the disadvantage of thermal lag, which is associated with (indirectly heated) thermal converters and is not entirely accurate because it relies on the emitter-collector resistances of the transistors being matched over its entire dynamic range.

GB 1,429,929 discloses a somewhat more complex arrangement in which two matched thermocouples are employed. The unknown A.C. input signal is superimposed on a D.C. in the heater of one thermocouple and this D.C. signal is varied by a feedback network to maintain a constant output at this thermocouple. The D.C. feedback signal is also applied to the heater of the other thermocouple, so that any difference in the thermocouple outputs is due to the unknown A.C. input signal. This difference is detected and is used to generate an A.C. feedback signal which is applied to the heater of the other thermocouple. The R.M.S. amplitude of this feedback signal (which is suitably a low-frequency sinewave) can be measured easily and is equal to the R.M.S. amplitude of the unknown A.C. input signal. It is indicated that thermistors can be employed in place of the thermocouples, but no circuit details of this variant are given. It should be noted that the thermocouples operate at a constant power so that for a given ambient temperature they only need to be matched at one operating point. Furthermore the problem of thermal lag is to some extent overcome by the feedback network; the settling time of the network is approximately equal to the settling time of the thermocouples divided by the loop gain.

U.S. Pat. No. 3,689,824 also discloses an R.M.S. voltage measuring circuit comprising two matched thermocouples and a feedback network. However in this arrangement a D.C. reference signal is applied to the heater of one thermocouple and the unknown A.C. input signal is fed via a gain-controlled amplifier to the heater of the other thermocouple. A feedback signal is derived from the difference in the thermocouple outputs and is used to vary the gain of the gain-controlled amplifier such that balance is maintained. The gain G of the gain-controlled amplifier is determined and an output voltage is generated which is equal to the voltage of the reference signal divided by the gain G, and represents the R.M.S. value of the voltage of the input signal.

U.S. Pat. No. 3,486,110 discloses various circuit arrangements for measuring A.C. signals. In one embodiment, the unknown A.C. signal is applied via a variable resistance network to the heater of a thermocouple and the thermocouple output is used as a feedback signal to vary the resistance until the output reaches a predetermined value. The feedback signal is also used to vary the resistance of a similar variable resistance network in series with the heater of a matched thermocouple. The output of the matched thermocouple is used as a further feedback signal to vary the output of a voltage source in series with the heater and resistance network of the matched thermocouple until the thermocouple output reaches a predetermined value. At equilibrium the R.M.S. value of the voltage of the voltage source is equal to the R.M.S. value of the unknown A.C. signal voltage.

In a variant of this circuit arrangement which is shown in simplified form in FIG. 8, the thermocouples are replaced by power-sensitive thermistor bridges A and B, each comprising a Wheatstone bridge having a thermistor THA or THB in one branch. The thermistor bridges are connected in series with each other and with two electronically ganged variable resistive attenuators 210 and 212. The unknown A.C. signal is applied via one attenuator 210 to a thermistor bridge A and a signal representing the out-of-balance condition of that bridge is used to vary the output e3 of a voltage source VS3 which is applied to both bridges in parallel. In the absence of any applied A.C. signal, this variable voltage source balances both bridges. A feedback signal representing the out-of-balance condition of the other bridge is used to control the output e2 of another variable voltage source VS2 which is applied via the other resistive attenuator 212 to the other bridge B. The R.M.S. value of this output voltage e2 is equal to the R.M.S. value of the unknown A.C. signal voltage e1.

Finally, D.G. Gentle in NPL Report DES 89 dated May 1990 (ISSN 0143-7305) describes an investigation into the linearity of the Hewlett-Packard HP 432A microwave power meter, which has been commercially available for some years before the earliest priority date of the present application. The relevant circuit diagram is given in FIG. 4 of the Report and shows a self-balancing thermistor bridge similar to bridges A and B as disclosed in U.S. Pat. No. 3,486,110 and described above. An operational amplifier which is responsive to an out-of-balance condition of the bridge applies a biasing voltage to the bridge (and hence to the thermistor) which is sufficient to maintain the thermistor at a temperature at which its resistance balances the bridge. The unknown microwave signal is applied to the thermistor and the change in voltage drop across the bridge due to the heating effect of the microwave signal is used to derive the relative power of the microwave signal. A similar bridge having a thermistor shielded against the microwave signal is used to compensate for ambient temperature changes.

The investigation showed that under carefully controlled conditions, such a power meter is capable of measuring power ratios over a 30 dB dynamic range with an uncertainty generally less than 0.002 dB, at frequencies ranging from 8.5 to 12 GHz. However, as shown in Appendix 1 of the report, the relationship between the input signal and the drive voltages across the thermistor bridges is somewhat complex and in normal use an approximation is used which enables a direct reading to be taken, albeit of lower accuracy.

A coaxial mount (the 8478B) is available for the HP 432A power meter and comprises two matched thermistors in a bridge circuit with two capacitors. The R.F. signal is applied to the thermistors in parallel and the D.C. biasing current is passed through the thermistors in series, as shown in FIG. A1 of Hewlett-Packard manual No. 08478-90015 dated November 1981.

The thermocouple-based circuits described in U.S. Pat. No. 3,689,824 and U.S. Pat. No. 3,486,110 share with the circuit of GB 1,489,929 the feature that two thermal converter circuits operate at a nominally constant power and need only to be matched at this power level in order to generate a D.C. or low-frequency A.C. signal whose R.M.S. amplitude accurately matches the R.M.S. amplitude of the unknown A.C. signal. However the advantages of operating at a constant power level are negated by ambient temperature fluctuations, which cause the temperatures and hence the outputs of the thermocouples to vary even if they dissapate a constant power. Furthermore the circuits described in these patents are complex. This complexity is avoided in the HP 432A meter described in the NPL report, but correspondingly complex calculations are required to obtain accurate results. Nevertheless, the excellent results obtained by the NPL indicate that the potential performance of instruments utilising the heating effect of an unknown A.C. signal is very high.

The thermistor-based circuit disclosed in U.S. Pat. No. 3,486,110 and discussed above with reference to FIG. 8 has the advantage that the thermistors run at a constant temperature irrespective of temperature fluctuations, so that the thermistor bridge circuits need only be matched at this temperature. However it will be seen from FIG. 8 that the unknown A.C. signal passes through variable voltage source VS3 as well as attenuator network 210 and this somewhat complex signal path is undesirable in high frequency and/or high accuracy applications. Furthermore, because voltage source VS3 is common to both bridge circuits, there is a possibility that high frequency signals will leak from one thermistor bridge circuit to the other, resulting in inaccurate measurements.

An object of the present invention is to provide a circuit for measuring the voltage or current of a high-frequency A.C. signal which goes some way towards fulfilling the potential indicated in the NPL report and in which at least some of the problems in the prior art circuits are alleviated.

Accordingly the invention provides a bridge circuit arrangement for measuring the amplitude of an A.C. signal, comprising first and second temperature-sensitive devices, one of said temperature-sensitive devices being incorporated in a balanced bridge circuit, power supply means coupled to said first and second temperature-sensitive devices and arranged to energise said balanced bridge circuit at a first pair of balanced terminals thereof, means for applying an A.C. signal to said first temperature-sensitive device and means for applying a compensating signal to the said second temperature-sensitive device, the signal which is applied to said one temperature-sensitive device being applied to a second pair of balanced terminals of said balanced bridge circuit, and feedback means arranged to vary the amplitude of said compensating signal in relation to the amplitude of said A.C. signal so as to maintain a predetermined relationship between the amplitudes of said signals.

Preferably the arrangement further comprises means for measuring the amplitude of said compensating signal. However the (voltage or current) amplitude of the compensating signal may alternatively be measured with an external meter, for example.

Preferably both of said temperature-sensitive devices are incorporated in respective balanced bridge circuits, each having a first and a second pair of balanced terminals, said balanced bridge circuits are each energised by said power supply means at their first pairs of balanced terminals, said A.C. signal is applied to the second pair of balanced terminals of one of said balanced bridge circuits and said compensating signal is applied to the second pair of balanced terminals of the other of said balanced bridge circuits.

Preferably the power supply means is feedback-controlled so as to maintain the resistances of said temperature-sensitive devices substantially constant, irrespective of the amplitude of said A.C. signal.

The compensating signal is preferably but not necessarily an A.C. signal, and may for example be a sine wave or a square wave of low frequency (e.g. 1 kHz) whose form factor is known and whose amplitude can easily be determined.

As will become apparent from the description of the preferred embodiments, the invention has the advantage over the prior art thermistor-based circuit of U.S. Pat. No. 3,486,110 that the signal path of the A.C. signal is shorter and simpler, and has the further advantage that the A.C. and compensating signals are isolated from each other by at least one (and preferably two) balanced bridges.

In another aspect the invention provides a circuit arrangement for measuring alternating current or voltage, comprising a power supply, at least one temperature-sensitive device arranged to carry a biasing signal generated by said supply, and means for superimposing an A.C. signal on the biasing signal carried in said temperature-sensitive device, the circuit arrangement being such that in use, the resistance of said temperature-sensitive device varies in dependence upon the amplitude of said A.C. signal and the circuit arrangement further comprising either: a) means for measuring a change in the biasing current through said temperature-sensitive device due to the heating effect of said A.C. signal, or b) means for measuring a change in the biasing voltage across said temperature-sensitive device due to the heating effect of said A.C. signal.

Preferably two temperature-sensitive devices having matched temperature coefficients are utilised (in a bridge circuit for example) in order to minimise the effects of fluctuations in the ambient temperature. In order to reduce further the effects of ambient temperature fluctuations, the temperature-sensitive devices are desirably housed in a thermally insulated enclosure, which may for example be temperature-controlled. As will become clear from the description below, circuits in accordance with this aspect of the invention have an output which is proportional to the square of the input, to a very close approximation, and this output can be converted to a linear reading. At least in preferred embodiments, the reading is substantially unaffected by ambient temperature fluctuations.

In a related aspect the invention provides a method of measuring or sensing the current or voltage of an A.C. signal comprising coupling said signal to the terminals of a temperature-sensitive device carrying a biasing signal under conditions in which the resistance of the temperature-sensitive device varies in dependence upon the amplitude of the A.C. signal, and measuring or sensing a change in the associated biasing voltage or biasing current due to the direct heating effect of said A.C. signal.

The A.C. signal may for example have a frequency of at least 0.5 Mhz, such as 10 Mhz, 30 Mhz, 50 Mhz, 100 Mhz or any intermediate frequency, for example.

Five embodiments of the invention will now be described by way of example only, with reference to FIGS. 1 to 8 of the accompanying drawings, of which:

Figure 6:
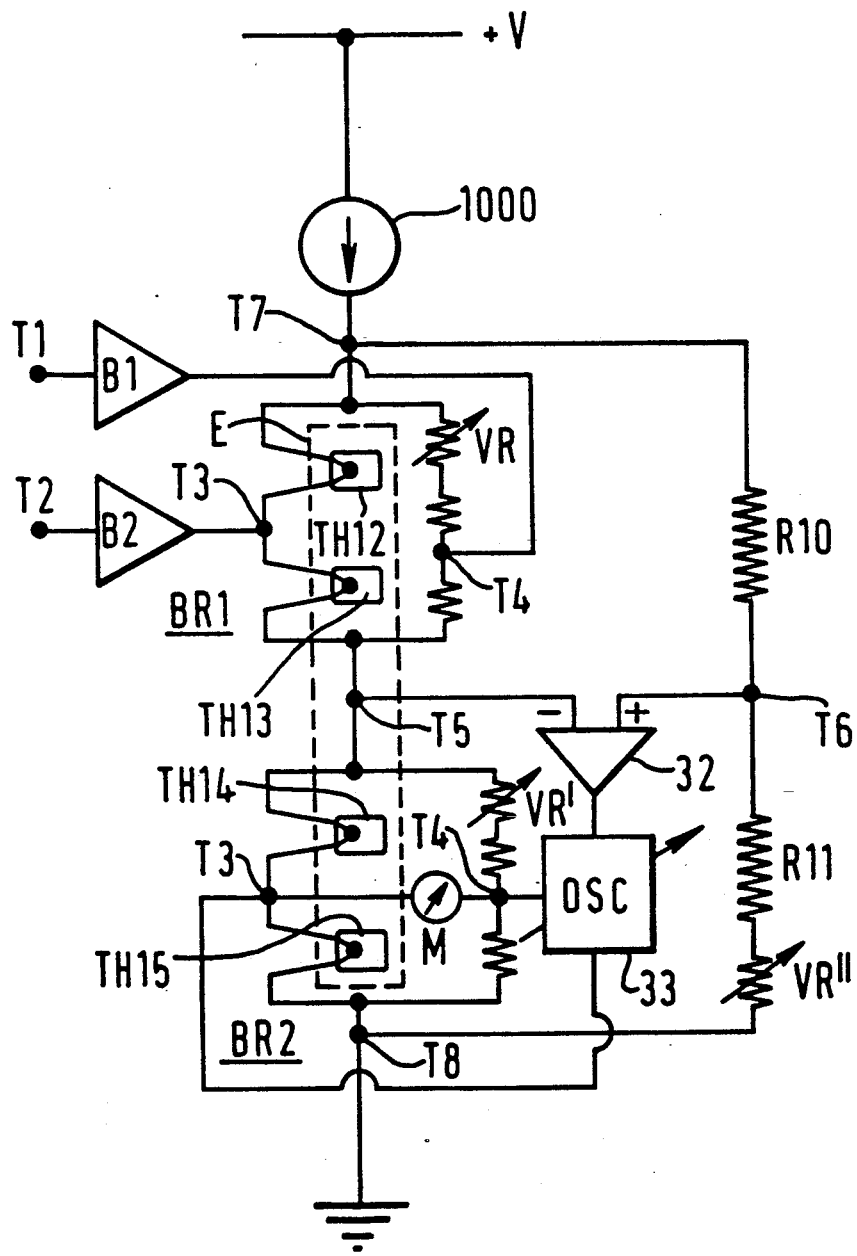
Figure 7:
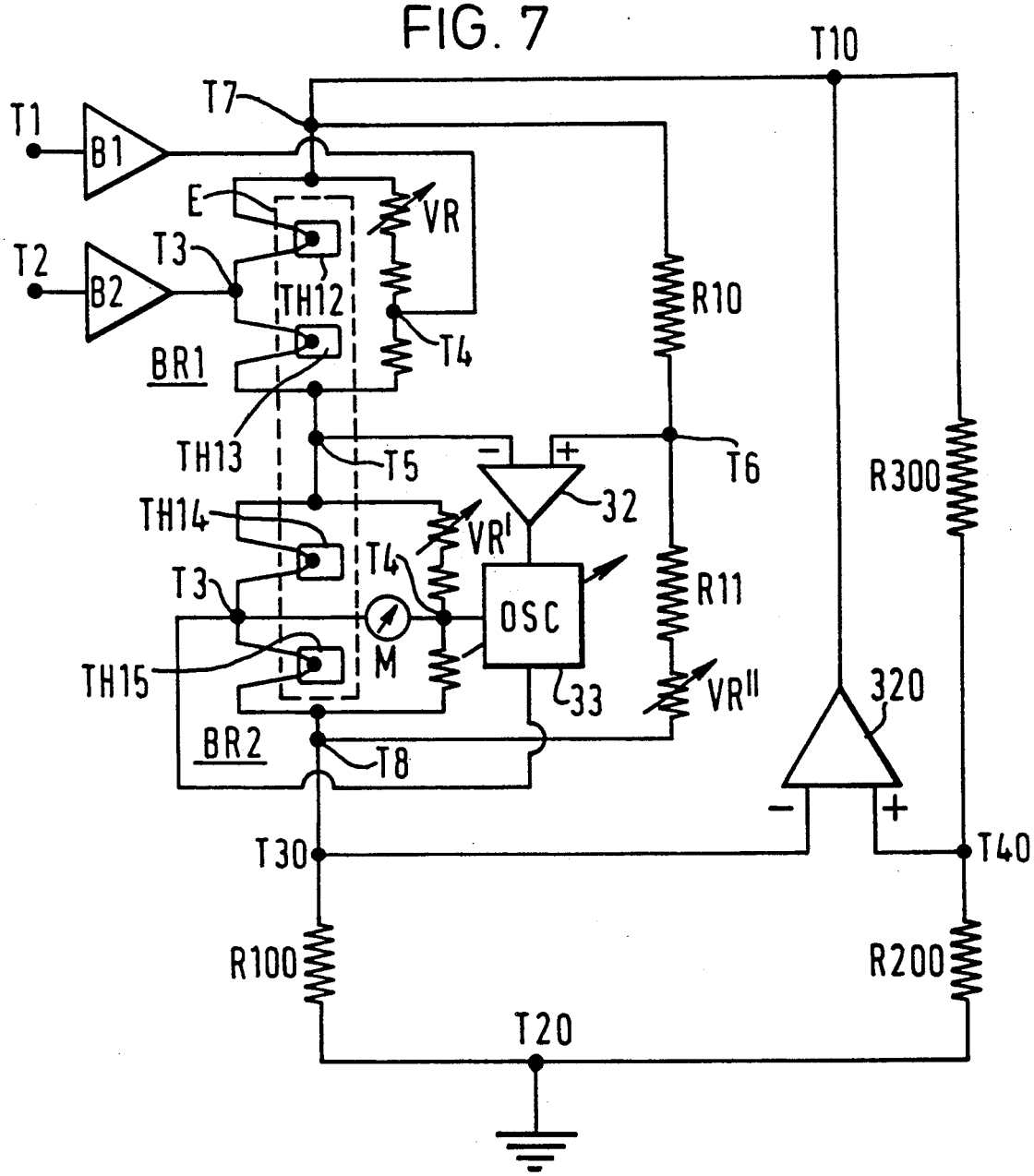
Figure 7A:
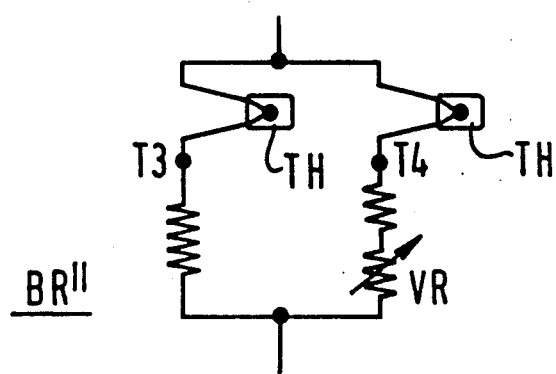
Figure 8:
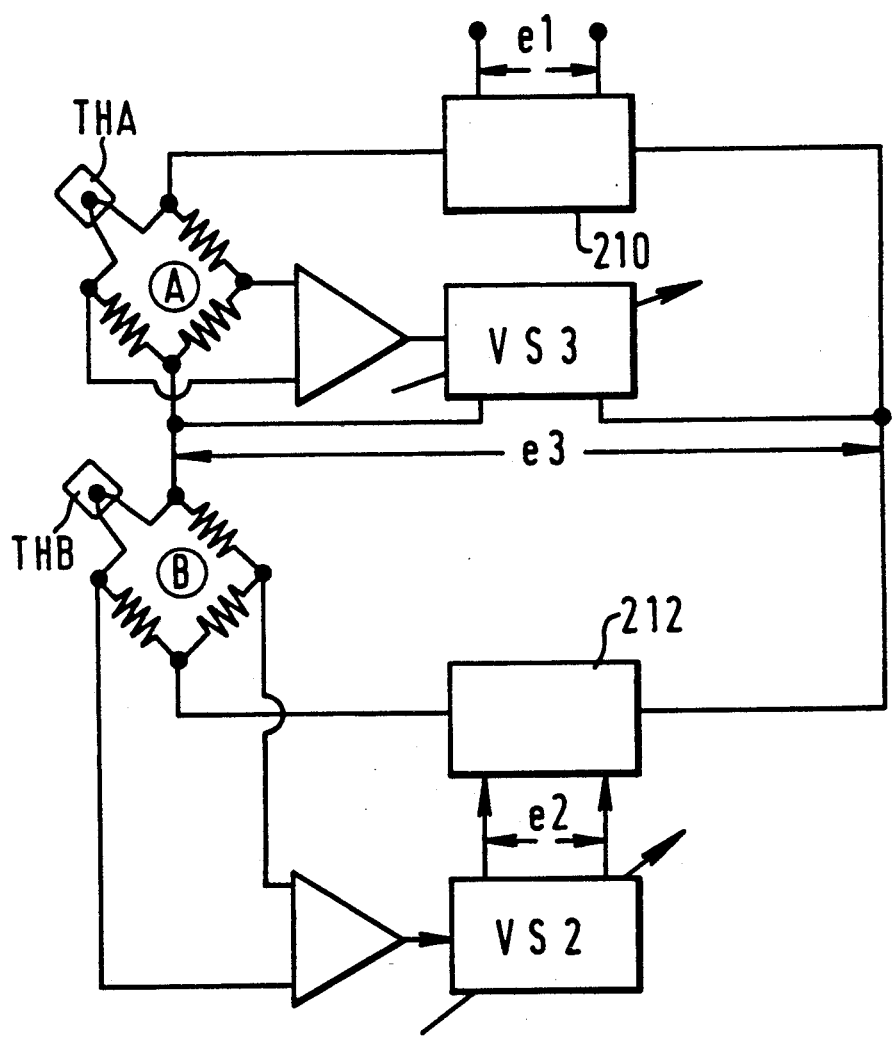

FIG. 6 is a circuit diagram of a measuring circuit in accordance with the first and second aspects of the invention, and FIG. 7 is a circuit diagram of a measuring circuit in accordance with the first aspect of the invention in which the resistance (and hence the temperature) of each thermistor is maintained constant, FIG. 7A is a circuit diagram of an alternative thermistor bridge which can be used in a variant of the circuit of FIG. 7, and FIG. 8 (which has already been referred to) is a simplified circuit diagram of a known arrangement.

It should be noted that each conversion circuit shown can be changed to a measurement circuit in accordance with the invention by connecting a suitable meter across terminals T3 and T4 and that each measurement circuit shown can be changed to a conversion circuit by the omission of meter M to leave two terminals which are adapted to be connected to an external D.C. meter.

Throughout the drawings, corresponding parts are denoted by common reference numerals.

Figure 1A:
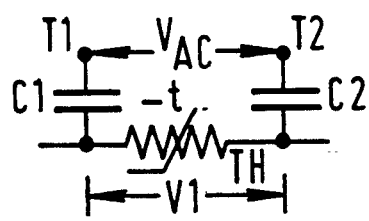
FIG. 1 is a circuit diagram showing a) a thermistor biased by a unidirectional voltage V1 and arranged to sense an alternating voltage $V_{A.C.}$ and b) a thermistor biased by a direct current I1 and arranged to sense an alternating current $I_{A.C.}$.
Figure 1B:
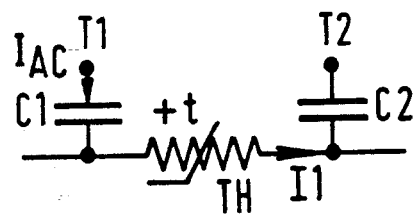

Referring first to FIGS. 1 and 2, it will be noted that in FIG. 1a), an ntc (negative temperature coefficient of resistance) thermistor TH is connected in series with coupling capacitors C1 and C2, whereas in FIG. 1b), a ptc (positive temperature coefficient of resistance) thermistor TH is connected in series with the coupling capacitors. The former arrangement is suitable for measuring the R.M.S. voltage $V_{A.C.}$ of an A.C. signal applied across the free terminals T1 and T2 of capacitors C1 and C2 whereas the latter arrangement is suitable for measuring the R.M.S. current $I_{A.C.}$ of an A.C. signal applied across these terminals.

Figure 2A:
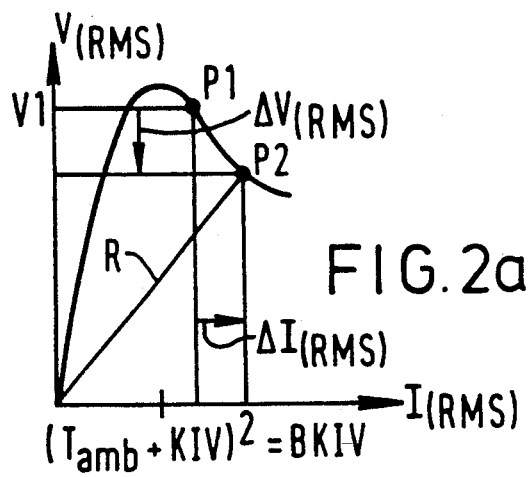
FIG. 2 shows a) the voltage-current characteristic of the thermistor shown in FIG. 1a) and b) the current-voltage characteristic of the thermistor shown in FIG. 1b)

If it is assumed that the thermistor TH in FIG. 1a) is biased by a constant current I1 then in the absence of any A.C. signal across terminals T1 and T2, the R.M.S. voltage drop across the thermistor is V1 and the operating point of the thermistor is, for example, P1 as shown in FIG. 2a). On applying an A.C. signal across terminals T1 and T2, an R.M.S. current $i_{A.C.}$ flows and the operating point moves to P2, which involves a change $\Delta V_{(R.M.S.)}$ in the R.M.S. voltage across the thermistor and a change $\Delta I_{(R.M.S.)}$ in the R.M.S. current through the thermistor, as shown in FIG. 2a). Since $(I1 + \Delta I_{R.M.S.})^2 = I1^2 + i_{A.C.}^2$ then by taking the square root of these expressions and expanding it can be shown that:

$$\Delta I_{(R.M.S.)} = i_{A.C.}^2/2I1 - i_{A.C.}^4/8I1^3 \ldots \approx i_{A.C.}^2/2I1 \text{ if } A.C. << I1$$

But $$\Delta V_{(R.M.S.)} = dV/dI \cdot \Delta I_{(R.M.S.)} = dV/dI \cdot i_{A.C.}^2/2I1,$$

and $i_{A.C.} = V_{A.C.}/R$, where R is the resistance of the thermistor at operating point P2 as shown in FIG. 2a).

$$\therefore \Delta V_{(R.M.S.)} = \frac{V_{A.C.}^2 \cdot dV/dI}{2R(V1 - \Delta V)} \approx \frac{V_{A.C.}^2 \cdot dV/dI}{2RV1}$$

Now the change $\Delta V$ in the biasing voltage is equal to the product of I1 and the change in resistance of the thermistor due to the heating effect of $V_{A.C.}$:

$$\Delta V = I1 \left[ \frac{V1 + \Delta V_{(R.M.S.)}}{I1 + \Delta I_{(R.M.S.)}} - \frac{V1}{I1} \right]$$

On simplifying this expression, and substituting $\Delta I_{(R.M.S.)} = \Delta V_{(R.M.S.)} \cdot dI/dV$, the expression:

$$\Delta V = \Delta V_{(R.M.S.)} \cdot (1 - R \cdot dI/dV)$$

is obtained. Hence the following expression for the drop $-\Delta V$ in the biasing voltage can be found by substituting for $\Delta V_{(R.M.S.)}$:

$$-\Delta V = \frac{V_{A.C.}^2}{2V1} (1 - R^{-1} \cdot dV/dI) \quad \text{(i)}$$

Figure 2B:
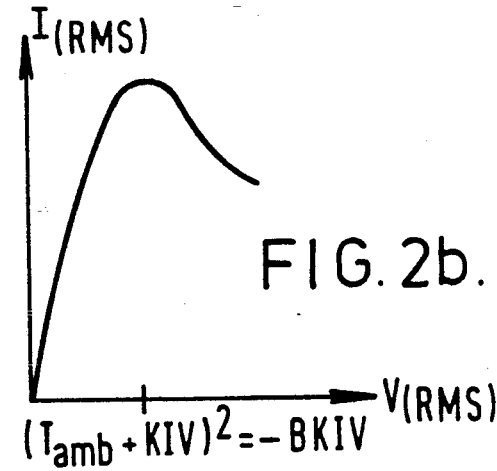

If the circuit of FIG. 1b) and the characteristic shown in FIG. 2b) are analysed in the same manner, the corresponding result:

$$-\Delta I = \frac{I_{A.C.}^2}{2I1} \cdot (1 - R \cdot dI/dV) \quad \text{(ii)}$$

is obtained for the change in the biasing current in the circuit of FIG. 1b) due to the A.C. $I_{A.C.}$.

It should be noted that the above analysis is not limited to a thermistor or other device having a voltage-current characteristic as shown in FIGS. 2a) or 2b) but is applicable to any device whose resistance is dependent on the voltage across or the current flowing in the device such that $dV/dI \neq R$.

However in the case that the temperature-sensitive device is a thermistor, it will now be shown that the factor $(1 - R^{-1} \cdot dV/dI)$ is substantially constant and nearly independent of the temperature when the operating point of the thermistor is well into the negative slope resistance portion of its voltage-current characteristic as shown in FIG. 2a).

The resistance R of a thermistor as a function of its absolute temperature is given by:

$$R = k \cdot e^{(B/T)} \quad \text{(iii)}$$

where k and B are constants.
But $$T = T_{amb} + KIV \quad \text{(iv)}$$

where $T_{amb}$ is the ambient temperature, K is a cooling constant which is dependent on the construction of the thermistor and also on its local environment, I is the R.M.S. current through the thermistor and V is the R.M.S. voltage across the thermistor.

By substituting (iv) in (iii) and differentiating, it can be shown that:

$$R^{-1} \cdot dV/dI = \frac{(T_{amb} + KIV)^2 - BKIV}{(T_{amb} + KIV)^2 + BKIV} \quad \text{(v)}$$

In the case of an ntc thermistor (where B is positive), a voltage maximum occurs at $T_{amb} + KIV = BKIV$ as shown in FIG. 2a) whereas in the case of a ptc thermistor (where B is negative), a current maximum occurs at $T_{amb} + KIV = -BKIV$ as shown in FIG. 2b). KIV is equal to the difference between the temperature T of the thermistor and the ambient temperature $T_{amb}$ and is normally small in relation to the ambient temperature.

From (v): 
$$1 - R^{-1} \cdot dV/dI = \frac{2BKIV}{(T_{amb} + KIV)^2 + BKIV} \quad \text{(vi)}$$

Figure 5:
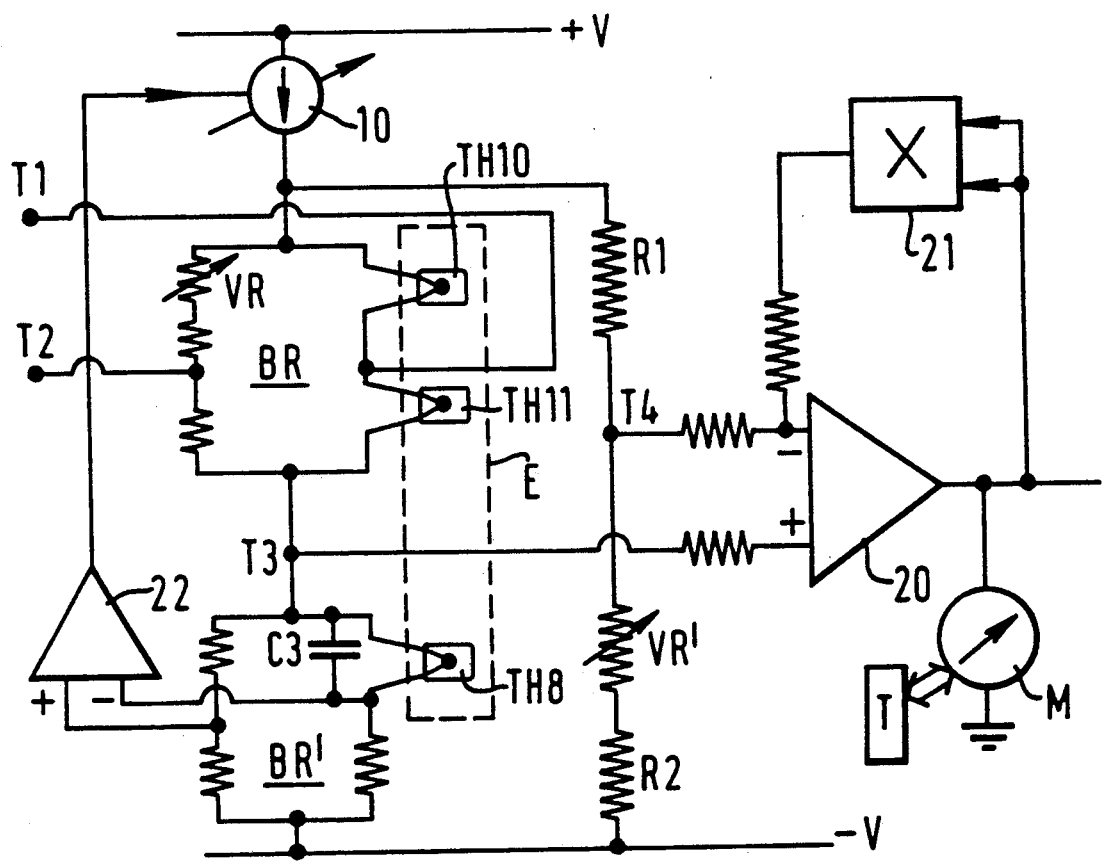
FIG. 5 is a circuit diagram of a preferred circuit arrangement in accordance with the second aspect of the invention which generates an output signal which is directly proportional to the R.M.S. value of the input signal.

But in the negative slope resistance portion of the voltage-current characteristic, i.e. to the right of the voltage or current maximum, $|BKIV|$ is greater than $T_{amb} + KIV$ and hence the factor $1 - R^{-1} \cdot dV/dI$ in expressions (i) and (ii) tends to the value 2 when the operating point of the thermistor is shifted to a current or voltage which is much larger than the current or voltage corresponding to the voltage maximum or current maximum as the case may be. This still leaves the variable biasing voltage V1 (FIG. 1a)) or biasing current I1 (FIG. 1b)) which affects the relationship between the input signal and the output of the circuit. In the embodiment of FIG. 5, the biasing current is varied so as to eliminate changes in the biasing voltage which are caused by ambient temperature fluctuations.

However in other embodiments, the instantaneous biasing voltage can be monitored periodically in the absence of an applied A.C. signal and the proportionality constant relating $\Delta V$ and $V_{A.C.}$ can be calculated accordingly, or alternatively the thermistor(s) can be housed in an enclosure whose temperature is regulated.

It should be noted that it is not essential to operate the thermistor in a negative slope resistance region of its characteristic in order to obtain useful results, and in fact it is not even necessary for the thermistor to exhibit a voltage or current maximum. However, the thermistor preferably has a high value of K (e.g. 10° C./mW or greater) and a high value of $|B|$ (e.g. 3,000 Kelvin or greater). In the case of a voltage-measuring circuit, the resistance of the thermistor at the operating point should be as high as possible, although in many applications this constraint can be overcome by employing a buffer amplifier having a high input impedance. A type RA25 thermistor as made by S.T.C. would be suitable in many applications. This thermistor comprises a small bead of thermistor material in an evacuated glass bulb and has a quoted B value of 4,200 Kelvin and a quoted K value of 80° C./mW. Its K value may be increased by providing a silvered or other reflective surface on the exterior of the glass bulb.

Further information on the behaviour of both ptc and ntc thermistors (including the conditions required for a current or voltage maximum) can be found in "Thermistors" by E. D. Macklen (published by Electrochemical Publications Ltd, Ayr, Scotland—1979).

In FIGS. 3 to 7A, it is assumed that the thermistors are of the type comprising a small (e.g. 0.5 mm diameter or less) bead of thermistor material in an evacuated glass bulb and accordingly the thermistors are shown somewhat pictorially in order to depict such a construction. It is also assumed that at least in the embodiments of FIGS. 3 to 5, the thermistor carrying the unknown A.C. signal is operated in a negative slope resistance portion of its current-voltage characteristic.

Figure 3:
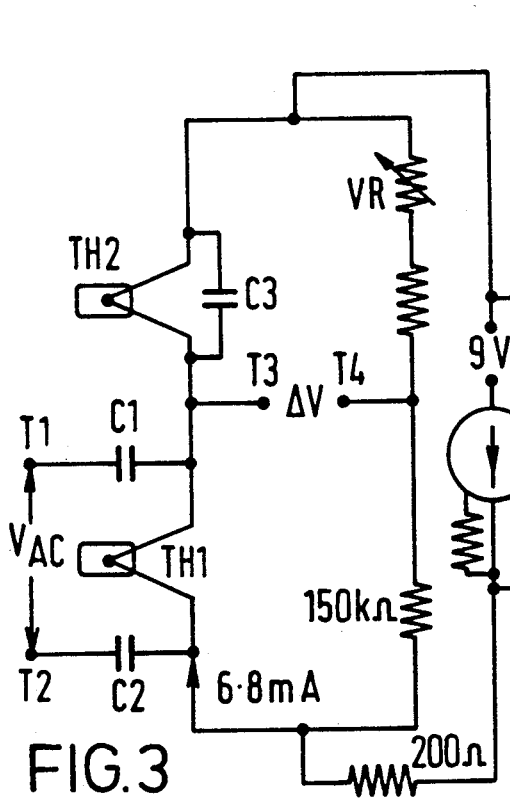
FIG. 3 is a circuit diagram of a conversion circuit for implementing the third (method) aspect of the invention which is based on the principle illustrated in FIGS. 1a) and 2a)

FIG. 3 shows a relatively simple circuit which has been built and tested in order to check the theory underlying the invention. Two type RA53 thermistors TH1 and TH2 (which have a negative temperature coefficient of resistance (B=3,250 Kelvin) are connected in series in one branch of a bridge circuit which is energised by a type LM 334Z constant current source 1. Since the thermistors have a much lower resistance than the resistors in the other branch of the bridge, they carry a substantially constant current of approximately 6.6 to 6.8 mA which is set by constant current source 1.

Since the two thermistors have nominally the same B value, by adjusting variable resistor VR to set the voltage across terminals T3 and T4 to zero, it can be ensured that any fluctuation in the ambient temperature, provided that it is experienced by both thermistors, will not lead to a fluctuation in the voltage across terminals T3 and T4. Thus thermistor TH2 compensates for ambient temperature fluctuations. The entire circuit is housed in a plastic box (not shown) with both thermistors located between a circuit board and an aluminium lid (not shown) which closes the box and tends to maintain the local environment of each thermistor at the same ambient temperature.

Two 2.2 uF polycarbonate coupling capacitors C1 and C2 are connected to the respective leads of thermistor TH1 and the free ends of these capacitors are connected to respective external terminals T1 and T2 across which an A.C. signal V is to be applied. A 1.1 uF polycarbonate bypass capacitor C3 is connected across thermistor TH2 in order to prevent this thermistor from being heated by the A.C. signal and constant current source 1 is isolated from this signal by a simple filter network comprising a 1 uF capacitor in series with a 200 ohm resistor, as shown.

RESULTS

The voltage across thermistor TH1 in the absence of an applied A.C. signal was measured with a digital voltmeter and was 0.8897 V. The current under these conditions was 6.6 mA, giving a resistance of 133 ohms. The gradient dV/dI of the voltage-current characteristic of thermistor TH1 was measured by adjusting the setting of current source 1 to vary the current very slightly, and measuring the resulting change in voltage drop across thermistor TH1. The slope resistance dV/dI was found to be approximately $-44$ ohms.

A 20 kHz sinusoidal signal was applied across terminals T1 and T2 and the R.M.S. voltage $V_{A.C.}$ (assumed to be $0.707 \times$ the measured peak voltage) was compared with the output voltage $\Delta V$ across terminals T3 and T4 after a small offset voltage of 1.53 mV (due to a slight inbalance in the bridge) had been subtracted from the latter voltage. The following results were obtained:

TABLE 1

| $\Delta V$ | $V_{A.C.}$ | $\Delta V/V_{A.C.}^2$ |
|---|---|---|
| 0.89 mV | 37.14 mV | 0.645 $V^{-1}$ |
| 3.01 mV | 69.48 mV | 0.623 $V^{-1}$ |
| 3.10 mV | 70.70 mV | 0.620 $V^{-1}$ |
| 6.94 mV | 106.44 mV | 0.613 $V^{-1}$ |

The expression (i) gives the following result for $\Delta V/V_{AC}^2$:

$$\Delta V/V_{A.C.}^2 = 1/1.7794(1+44/133) = 0.749 V^{-1}.$$

Thus the results shown in Table 1 are reasonably consistent with expression (i), and the fact that $\Delta V$ is slightly lower than expected can possibly be explained by transfer of heat from thermistor TH1 to thermistor TH2. The discrepancy in the result for $\Delta V = 0.89$ mV is believed to be due to the difficulty in measuring the bridge offset voltage.

The remaining embodiments will now be described briefly.

Figure 4:
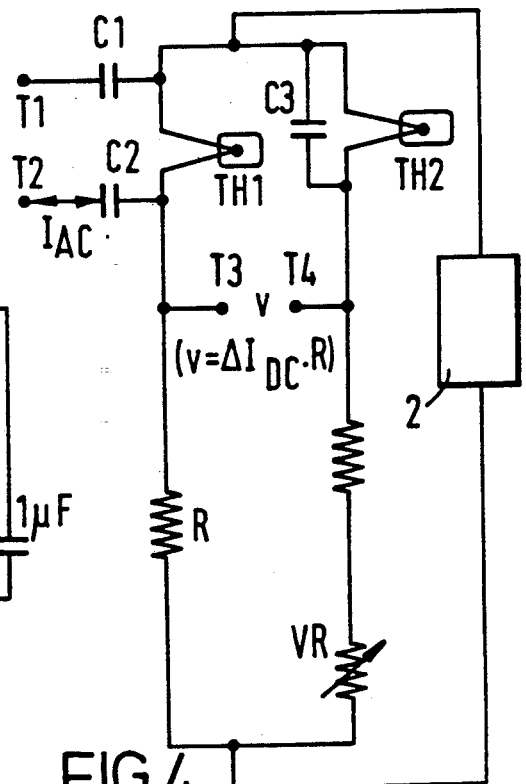
FIG. 4 is a circuit diagram of a similar conversion circuit which is based on the principle illustrated in FIGS. 1b) and 2b)

FIG. 4 shows a circuit for measuring an unknown high frequency current I which flows between current-measuring terminals T1 and T2 via coupling capacitors C1 and C2 and thermistor TH1. The circuit comprises a bridge circuit energised by a regulated voltage from a low-impedance D.C. supply 2.

The bridge circuit comprises a thermistor TH1 having a positive temperature coefficient of resistance, which is connected in series with a resistor R in one arm of the bridge, and a matched thermistor TH2 connected in series with another resistor and a variable resistor VR in the other arm of the bridge. The resistance of each thermistor when energised from supply 2 is large in comparison with the resistance of its associated resistor(s). Hence the unidirectional voltage across thermistor TH1 is very nearly equal to the supply voltage, which is maintained constant. A high impedance voltmeter (not shown) may be connected between external terminals T3 and T4 in order to measure voltage v. In the absence of any applied signal at terminals T1 and T2, the bridge is balanced using variable resistor VR2, so that the voltage v is zero. In order to prevent the bridge from drifting out of balance due to local ambient temperature fluctuations at the thermistors, they may be enclosed in a thermally insulated housing (not shown), and in any case they are preferably substantially thermally isolated from each other.

The change $\Delta I$ in the biasing current through thermistor TH1 is equal to v/R and hence $I_{A.C.}$ can be found from expression (ii).

Bypass capacitor C3 prevents thermistor TH2 from being heated by the A.C. signal.

FIG. 5 shows two thermistor bridges BR and BR' connected in series with a variable current source 10. A differential amplifier 22 has its inputs connected across one pair of nominally balanced terminals of bridge BR' (which includes an ntc thermistor TH8) and sends a feedback signal to current source 10 which varies the biasing current through bridges BR and BR' in response to any ambient temperature fluctuations so as to keep bridge BR' balanced. A variable resistor VR in one branch of bridge BR is adjusted so as to balance bridge BR under these conditions. Accordingly an unknown A.C. signal applied to one pair of balanced terminals of bridge BR via input terminals T1 and T2 passes through ntc thermistors TH10 and TH11 in parallel and is isolated from the other balanced pair of terminals of this bridge. In order to prevent this A.C. signal from upsetting the balance of the bridge by heating thermistors TH10 and TH11 in a ratio which is different from the ratio of their resistances, thermistors TH10 and TH11 are preferably of matched impedance. Furthermore a bypass capacitor C3 is connected across thermistor TH8 in order to avoid any heating effect from A.C. which leaks from bridge BR due to any slight inbalance. In order to ensure that the thermistors in bridges BR and BR' carry a constant current, and to ensure that the measured change in the voltage drop across bridge BR is essentially equal to the change in the voltage drop across its thermistors, the resistors in bridges BR and BR' have a resistance which is substantially greater than (e.g. 10 times) the resistance of their associated thermistors, which are enclosed in a thermally insulated housing E.

In order to enable the change in voltage drop (due to the heating effect of the A.C. signal) across bridge BR to be measured, a voltage divider comprising resistors R1, R2 and VR' is connected in parallel with the series combination of bridges BR1 and BR'. The resistance of this voltage divider is high in comparison with that of the thermistor bridges in order to ensure that the current through them is not affected. Variable resistor VR' is adjusted to balance terminals T3 and T4 in the absence of any applied signal at terminals T1 and T2, and the square root of the voltage drop across terminals T3 and T4 is derived by an operational amplifier circuit (known per se) comprising a differential amplifier 20 having a multiplier 21 in its feedback loop. The voltage level at the output of this circuit is measured by a digital voltmeter M which is provided with a look-up table T to correct any slight non-linearities in the measurement. Provided that the A.C. signal voltage is small in comparison with the biasing voltage across the thermistors, look-up table T could be dispensed with.

As noted in connection with expression (vi), the temperature dependence of the relationship between the input signal and the output signal is almost eliminated by maintaining the biasing voltage in thermistor TH8 constant. Preferably the current through the thermistors TH10 and TH11 is substantially greater than the current corresponding to the voltage maximum, e.g. at least four times as great, in order to ensure that $V_{A.C.}^2/\Delta V$ is nearly constant.

FIG. 6 shows a circuit arrangement in which two thermistor bridges BR1 and BR2 are connected in series with a constant current source 1000, the series combination being connected in parallel with a voltage divider comprising resistors R10 and R11 and variable resistor VR" at terminals T7 and T8 to form a bridge circuit. Bridge circuit BR1 comprises two matched ntc thermistors TH12 and TH13 and is balanced by adjusting variable resistor VR, whereby an unknown A.C. signal applied via terminals T1 and T2 and unity-gain buffer amplifiers B1 and B2 to balanced terminals T3 and T4 flows through thermistors TH12 and TH13 in parallel but does not appear across the other pair of balanced terminals of this bridge.

Similarly bridge BR2 comprises two matched ntc thermistors TH14 and TH15 and is balanced by adjusting variable resistor VR.

The total resistance of the thermistors in bridge BR1 is less than the resistance of the associated resistors in this bridge and is substantially less than the resistance of resistor R10. Similarly the total resistance of the thermistors in bridge BR2 is less than the resistance of the associated resistors in this bridge and is substantially less than the total resistance of resistors R11 and VR". Terminals T5 and T6 of the overall bridge circuit are balanced by adjusting variable resistor VR" in the absence of any applied A.C. signal at terminals T1 and T2. Consequently any voltage drop across terminals T5 and T6 due to such an A.C. signal would be nearly proportional to the square of the R.M.S. voltage of that signal, in the absence of any further circuitry. However this relationship is not exact, and accordingly the circuit arrangement of FIG. 6 includes an oscillator 33 which applies a low-frequency (e.g. 1 to 10 kHz) sinewave compensating signal to balanced terminals T3 and T4 of bridge BR2. The amplitude of this compensating signal is controlled by a feedback signal from a differential amplifier 32 whose input terminals are connected to terminals T5 and T6. At equilibrium, if it is assumed that the bridges BR1 and BR2 are similar, then the R.M.S. voltage across terminals T3 and T4 of bridge BR2 (which is measured by a meter M) is equal to the R.M.S. voltage across terminals T3 and T4 of bridge BR1. Even if the bridges BR1 and BR2 are not perfectly matched, there will be a linear relationship between these R.M.S. voltages, owing to the well defined relationship between the A.C. and D.C. voltages across the two pairs of balanced terminals of each bridge which is due to the current source 1000.

The oscillator 33 may be arranged to generate a square wave compensating signal rather than a sinewave compensating signal for example, in which case meter M would be arranged to sample each cycle to determine its amplitude.

As in the previously described circuits, the thermistors are enclosed within a common thermally insulated housing E. Although it is not essential, it is preferred that the thermistors are operated in the negative slope resistance portion of their current-voltage characteristic (i.e. somewhat to the right of the voltage maximum such as at operating point P1 as shown in FIG. 2a) since this tends to maintain them at a constant temperature, irrespective of ambient temperature fluctuations. Nevertheless, even the circuit of FIG. 6 cannot be expected to be completely immune to ambient temperature fluctuations.

This problem is largely alleviated in the circuit arrangement of FIG. 7, which incorporates between terminals T7 and T8 a circuit identical to that shown between terminals T7 and T8 of FIG. 6. However, instead of energising terminals T7 and T8 with a constant current source, they are energised by a voltage which varies in such a manner as to maintain constant the resistance of the thermistor bridge circuits between these terminals. Under these conditions the total R.M.S. voltage and current through each thermistor is constant, irrespective of variations in the A.C. input signal applied to terminals T1 and T2 and irrespective of ambient temperature fluctuations. Accordingly, a linear relationship will always exist between the R.M.S. value of the voltage measured by meter M and the R.M.S. value of the voltage of the unknown signal applied to input terminals T1 and T2.

This is achieved by incorporating the bridges BR1 and BR2 in one branch of a bridge circuit whose three other branches comprise resistors R100, R200 and R300 respectively. A differential amplifier 320 compares the potentials at terminals T30 and T40 and applies an output voltage to energise the bridge at terminal T10. This balances the bridge. Conveniently the resistances of resistors R100, R200 and R300 each have a value of (say) R, in which case the total resistance of bridge circuits BR1 and BR2 between terminals T7 and T8 is equal to R.

It should be noted that, unlike the prior art circuit of FIG. 8, the circuit of FIG. 7 is arranged such that the unknown and compensating A.C. signals are each applied to balanced pairs of terminals of respective bridges which are energised at their other balanced pairs of terminals. Accordingly it is practically impossible for the A.C. signal applied to one pair of thermistors to leak to the pair of thermistors to which the other A.C. signal is applied.

Finally, it should be noted that FIG. 7A shows an alternative thermistor bridge circuit BR''' comprising thermistors TH which are arranged to be energised in series by the A.C. signal (applied across terminals T3 and T4) and in parallel by the biasing signal. Such a bridge may be substituted for the bridges BR1 and BR2 in the circuit of FIG. 7, for example. Capacitors (including a pre-set variable capacitor for balancing purposes) may be substituted for the resistors in the thermistor bridges of FIGS. 5, 6 and 7.

I claim:

1. A bridge circuit arrangement for measuring the amplitude of an A.C. signal, comprising first and second temperature-sensitive devices, said first temperature-sensitive device being incorporated in a balanced bridge circuit, power supply means coupled to said first and second temperature-sensitive devices and arranged to energise said balanced bridge circuit at a first balanced pair of terminals thereof, means for applying an A.C. signal to one of said temperature-sensitive devices and means for applying a compensating signal to the other of said temperature-sensitive devices, one of said signals being applied to said first temperature-sensitive device via a second balanced pair of terminals of said balanced bridge circuit and thereby isolated from the other of said signals, and feedback means coupled to said first and second temperature-sensitive devices, said feedback means being arranged to vary the amplitude of said compensating signal in relation to the amplitude of said A.C. signal so as to maintain a predetermined relationship between the amplitudes of said signals.

2. A bridge circuit arrangement as claimed in claim 1 wherein said temperature-sensitive devices exhibit a temperature-sensitive resistance and said power supply means is feedback-controlled so as to maintain the resistances of said temperature-sensitive devices substantially constant, irrespective of the amplitude of said A.C. signal and irrespective of ambient temperature fluctuations.

3. A bridge circuit arrangement as claimed in claim 1, wherein both of said temperature-sensitive devices are incorporated in respective balanced bridge circuits, each balanced bridge circuit having a first and a second balanced pair of terminals, said balanced bridge circuits are each energised by said power supply at their first balanced pairs of terminals, said A.C. signal is applied to the second balanced pair of terminals of one of said balanced bridge circuits and said compensating signal is applied to the second balanced pair of terminals of the other of said bridge circuits.

4. A bridge circuit arrangement as claimed in claim 3 wherein said balanced bridge circuits are connected in series at their first pairs of balanced terminals and said feedback means is arranged to control the amplitude of said compensating signal in dependence upon the potential at a common terminal of said series-connected balanced bridge circuits.

5. A bridge circuit arrangement as claimed in claim 1 wherein the or each said balanced bridge circuit includes a pre-set resistor in one arm thereof and further comprises two thermistors connected in series between one pair of balanced terminals and connected in parallel between the other pair of balanced terminals.

6. A bridge circuit arrangement as claimed in claim 1, further comprising means for measuring the amplitude of said compensating signal.

7. A circuit arrangement for measuring an A.C. signal, comprising a power supply arranged to generate a constant-current biasing signal, at least one temperature-sensitive device having a negative temperature coefficient of resistance and arranged to carry said constant-current biasing signal, said temperature-sensitive device having a pair of terminals and said biasing signal being arranged to generate a biasing voltage across said terminals, and means for superimposing said A.C. signal on said constant-current biasing signal carried in said temperature-sensitive device so as to vary the resistance of said temperature-sensitive device and thereby vary said biasing voltage across said terminals thereof in dependence upon the amplitude of said A.C. signal.

8. A circuit arrangement as claimed in claim 7 wherein the temperature-senstive device exhibits a voltage maximum in its current-voltage characteristic, and said power supply is arranged to pass a biasing current through said temperature-sensitive device which is greater than the current corresponding to said voltage maximum.

9. A circuit arrangement as claimed in claim 7 wherein two such temperature-sensitive devices are incorporated in a substantially balanced bridge circuit, one balanced pair of terminals of said balanced bridge circuit being coupled to said A.C. signal and the other balanced pair of terminals of said balanced bridge circuit being coupled to said power supply.

10. A circuit arrangement as claimed in claim 7 wherein said means for superimposing said A.C. signal comprises two coupling capacitors connected to respective terminals of a said temperature-sensitive device.

11. A circuit arrangement as claimed 7 wherein said temperature-sensitive device is a thermistor.

12. A circuit arrangement as claimed in claim 7 wherein said temperature-sensitive device is incorporated in one arm of a balanced bridge circuit, said balanced bridge circuit being energised at one pair of balanced terminals thereof by said power supply and including a further temperature-sensitive device in another arm thereof for compensating for the effect of ambient temperature changes on said biasing voltage, said balanced bridge circuit having another pair of balanced terminals across which an output voltage is developed in response to said A.C. signal.

13. A circuit arrangement as claimed in claim 12, further comprising means for deriving a signal proportional to the square root of said output voltage.

14. A circuit arrangement as claimed in claim 7, further comprising meter means arranged to measure changes in said biasing voltage due to said A.C. signal.

15. A circuit arrangement for measuring an A.C. signal, comprising a power supply arranged to generate a constant-voltage biasing signal across at least one temperature-sensitive device, said temperature-sensitive device having a positive temperature coefficient of resistance and said biasing signal being arranged to generate a biasing current in said temperature-sensitive device, and means for superimposing said A.C. signal on said biasing signal in said temperature-sensitive device so as to vary the resistance of said temperature-sensitive device and thereby vary said biasing current in dependence upon the amplitude of said A.C. signal.

16. A circuit arrangement as claimed in claim 15 wherein the temperature-sensitive device exhibits a current maximum in its current-voltage characteristic, and said power supply means is arranged to apply a biasing voltage across said temperature-sensitive device which is greater than the voltage corresponding to said current maximum.

17. A circuit arrangement as claimed in claim 15 wherein two such temperature-sensitive devices are incorporated in a substantially balanced bridge circuit, one balanced pair of terminals of said balanced bridge circuit being coupled to said A.C. signal and the other balanced pair of terminals of said balanced bridge circuit being coupled to said power supply.

18. A circuit arrangement as claimed in claim 15 wherein said means for superimposing said A.C. signal comprises two coupling capacitors connected to respective terminals of a said temperature-sensitive device.

19. A circuit arrangement as claimed in claim 15 wherein said temperature-sensitive device is a thermistor.

20. A circuit arrangement as claimed in claim 15, further comprising meter means arranged to measure changes in said biasing current due to said A.C. signal.

* * * * *